United States Patent
Pinarbasi et al.

(10) Patent No.: US 11,723,217 B2
(45) Date of Patent: Aug. 8, 2023

(54) MAGNETIC TUNNEL JUNCTION ELEMENT WITH RU HARD MASK FOR USE IN MAGNETIC RANDOM-ACCESS MEMORY

(71) Applicant: Integrated Silicon Solution, (Cayman) Inc., Grand Cayman (KY)

(72) Inventors: Mustafa Pinarbasi, Morgan Hill, CA (US); Jacob Anthony Hernandez, Morgan Hill, CA (US); Cheng Wei Chiu, Milpitas, CA (US)

(73) Assignee: Integrated Silicon Solution, (Cayman) Inc., Grand Cayman (KY)

( * ) Notice: Subject to any disclaimer, the term of this patent is extended or adjusted under 35 U.S.C. 154(b) by 0 days.

(21) Appl. No.: 17/721,374

(22) Filed: Apr. 15, 2022

(65) Prior Publication Data

US 2022/0238601 A1   Jul. 28, 2022

Related U.S. Application Data

(63) Continuation of application No. 16/392,440, filed on Apr. 23, 2019, now Pat. No. 11,329,100.

(51) Int. Cl.
| | | |
|---|---|---|
| *H01L 21/00* | (2006.01) | |
| *H10B 61/00* | (2023.01) | |
| *G11C 11/16* | (2006.01) | |
| *H10N 50/01* | (2023.01) | |
| *H10N 50/10* | (2023.01) | |
| *H10N 50/80* | (2023.01) | |

(52) U.S. Cl.
CPC ............ *H10B 61/10* (2023.02); *G11C 11/161* (2013.01); *H10N 50/01* (2023.02); *H10N 50/10* (2023.02); *H10N 50/80* (2023.02)

(58) Field of Classification Search
CPC ....... H01L 27/224; H10B 61/10; H10N 50/80
See application file for complete search history.

(56) References Cited

U.S. PATENT DOCUMENTS

| | | | |
|---|---|---|---|
| 6,326,218 | B1 | 12/2001 | Yunogami et al. |
| 7,138,341 | B1 | 11/2006 | Sharma |
| 9,425,387 | B1 | 8/2016 | Liu et al. |
| 10,014,465 | B1 | 7/2018 | Liu et al. |
| 2007/0253120 | A1 | 11/2007 | Saito et al. |
| 2008/0213627 | A1 | 9/2008 | Ohsawa et al. |
| 2009/0256220 | A1 | 10/2009 | Horng et al. |

(Continued)

OTHER PUBLICATIONS

International Search Report and Written Opinion from PCT Application No. PCT/US2020/029334, dated Jul. 20, 2020, 8 pages.

*Primary Examiner* — Douglas M Menz

(57) ABSTRACT

A magnetic memory element has a Ru hard mask layer. The use of Ru advantageously allows for closer spacing of adjacent magnetic memory elements leading to increased data density. In addition, the use of Ru as a hard mask reduces parasitic electrical resistance by virtue of the fact that Ru does not oxidize in ordinary manufacturing environments. The magnetic memory element can be formed by depositing a plurality of memory element layers, depositing a Ru hard mask layer, depositing a RIEable layer over the Ru hard mask layer, and forming a photoresist mask over the hard mask layer. A reactive ion etching can be performed to transfer the image of the photoresist mask onto the RIEable layer to form a RIEable mask. An ion etching can then be performed to transfer the image of the RIAable mask onto the underlying Ru hard mask and underlying memory element layers.

17 Claims, 25 Drawing Sheets

Self aligned

(56) References Cited

U.S. PATENT DOCUMENTS

2015/0104882 A1  4/2015 Jung et al.
2018/0331279 A1  11/2018 Shen et al.
2020/0220072 A1  7/2020 Marchack et al.
2020/0303627 A1  9/2020 Kumura

MAGNETIC TUNNEL JUNCTION ELEMENT WITH RU HARD MASK FOR USE IN MAGNETIC RANDOM-ACCESS MEMORY

CROSS-REFERENCE TO RELATED APPLICATION

This application is a continuation of U.S. patent application Ser. No. 16/392,440, entitled MAGNETIC TUNNEL JUNCTION ELEMENT WITH RU HARD MASK FOR USE IN MAGNETIC RANDOM-ACCESS MEMORY, filed on Apr. 23, 2019, now U.S. Pat. No. 11,329,100, issued May 10, 2022, the entirety of which is incorporated herein by reference for all purposes.

FIELD OF THE INVENTION

The present invention relates to magnetic random-access memory (MRAM) and more particularly to a memory element structure having a Ru hard mask layer for increased data density and reduced parasitic electrical resistance.

BACKGROUND

Magnetic Random-Access Memory (MRAM) is a non-volatile data memory technology that stores data using magnetoresistive cells such as Magnetoresistive Tunnel Junction (MTJ) cells. At their most basic level, such MTJ elements include first and second magnetic layers that are separated by a thin, non-magnetic layer such as a tunnel barrier layer, which can be constructed of a material such as Mg—O. The first magnetic layer, which can be referred to as a reference layer, has a magnetization that is fixed in a direction that is perpendicular to that plane of the layer. The second magnetic layer, which can be referred to as a magnetic free layer, has a magnetization that is free to move so that it can be oriented in either of two directions that are both generally perpendicular to the plane of the magnetic free layer. Therefore, the magnetization of the free layer can be either parallel with the magnetization of the reference layer or anti-parallel with the direction of the reference layer (i.e. opposite to the direction of the reference layer).

The electrical resistance through the MTJ element in a direction perpendicular to the planes of the layers changes with the relative orientations of the magnetizations of the magnetic reference layer and magnetic free layer. When the magnetization of the magnetic free layer is oriented in the same direction as the magnetization of the magnetic reference layer, the electrical resistance through the MTJ element is at its lowest electrical resistance state. Conversely, when the magnetization of the magnetic free layer is in a direction that is opposite to that of the magnetic reference layer, the electrical resistance across the MTJ element is at its highest electrical resistance state.

The switching of the MTJ element between high and low resistance states results from electron spin transfer. An electron has a spin orientation. Generally, electrons flowing through a conductive material have random spin orientations with no net spin orientation. However, when electrons flow through a magnetized layer, the spin orientations of the electrons become aligned so that there is a net aligned orientation of electrons flowing through the magnetic layer, and the orientation of this alignment is dependent on the orientation of the magnetization of the magnetic layer through which they travel. When the orientations of the magnetizations of the free and reference layer are oriented in the same direction, the majority spin of the electrons in the free layer is in the same direction as the orientation of the majority spin of the electrons in the reference layer. Because these electron spins are in generally the same direction, the electrons can pass relatively easily through the tunnel barrier layer. However, if the orientations of the magnetizations of the free and reference layers are opposite to one another, the spin of majority electrons in the free layer will be generally opposite to the majority spin of electrons in the reference layer. In this case, electrons cannot easily pass through the barrier layer, resulting in a higher electrical resistance through the MTJ stack.

Because the MTJ element can be switched between low and high electrical resistance states, it can be used as a memory element to store a bit of data. For example, the low resistance state can be read as a "0", whereas the high resistance state can be read as a "1". In addition, because the magnetic orientation of the magnetic free layer remains in its switched orientation without any electrical power to the element, it provides a robust, non-volatile data memory bit.

To write a bit of data to the MTJ cell, the magnetic orientation of the magnetic free layer can be switched from a first direction to a second direction that is 180 degrees from the first direction. This can be accomplished, for example, by applying a current through the MTJ element in a direction that is perpendicular to the planes of the layers of the MTJ element. An electrical current applied in one direction will switch the magnetization of the free layer to a first orientation, whereas switching the direction of the current such that it is applied in a second direction will switch the magnetization of the free layer to a second, opposite orientation. Once the magnetization of the free layer has been switched by the current, the state of the MTJ element can be read by reading a current across the MTJ element, thereby determining whether the MTJ element is in a "1" or "0" bit state. Advantageously, once the switching electrical current has been removed, the magnetic state of the free layer will remain in the switched orientation until such time as another electrical current is applied to again switch the MTJ element. Therefore, the recorded data bit is non-volatile in that it remains intact in the absence of any electrical power.

SUMMARY

The present invention provides a magnetic memory structure that includes a tunnel junction structure and a Ru hard mask layer formed over the tunnel junction structure.

The use of a Ru hard mask in a memory element structure provides multiple advantageous benefits. For example, Ru does not form an insulating oxide and therefore imparts little to no parasitic electrical resistance to the memory element structure.

In addition, Ru has a high resistance to removal by ion etching and chemical mechanical polishing (CMP). This allows the Ru hard mask to be very thin, while still being able to withstand an ion etching process used to remove tunnel junction memory element material to form a memory element pillar. The reduced thickness results in less shadowing between memory elements, especially during high angle ion etching used to remove redeposited material from the memory element pillars. This reduced shadowing effect allows the memory elements to be spaced closer together than would otherwise be possible using a different, thicker hard mask layer.

A memory element pillar having a Ru hard mask can be formed by a process that includes depositing a plurality of memory element layers over a substrate. A Ru hard mask is deposited over the plurality of memory element pillars, and a mask structure is formed over the Ru hard mask layer. An ion etching is then performed to transfer the image of the mask structure onto the Ru hard mask layer and the plurality of memory element pillars, thereby forming a memory element pillar.

The mask structure formed over the Ru hard mask layer can be formed by depositing a material that can be removed by reactive ion etching (RIEable material), and then forming a photoresist mask over the RIEable material. A reactive ion etching can then be performed to transfer the image of the photoresist mask onto the underlying RIEable material.

The RIEable material can be one or more of tantalum, tantalum nitride or silicon oxide, and the reactive ion etching can be performed using a chemistry that is chosen to readily remove the RIEable material. For example, if the RIEable material is tantalum or tantalum nitride, the reactive ion etching can be performed in an atmosphere that includes fluorine or chlorine. If the RIEable material is silicon oxide, the reactive ion etching can be performed using an atmosphere that includes fluorine.

These and other features and advantages of the invention will be apparent upon reading of the following detailed description of the embodiments taken in conjunction with the figures in which like reference numeral indicate like elements throughout.

BRIEF DESCRIPTION OF THE DRAWINGS

For a fuller understanding of the nature and advantages of this invention, as well as the preferred mode of use, reference should be made to the following detailed description read in conjunction with the accompanying drawings which are not to scale.

DETAILED DESCRIPTION

The following description is of the best embodiments presently contemplated for carrying out this invention. This description is made for the purpose of illustrating the general principles of this invention and is not meant to limit the inventive concepts claimed herein.

Figure 1:
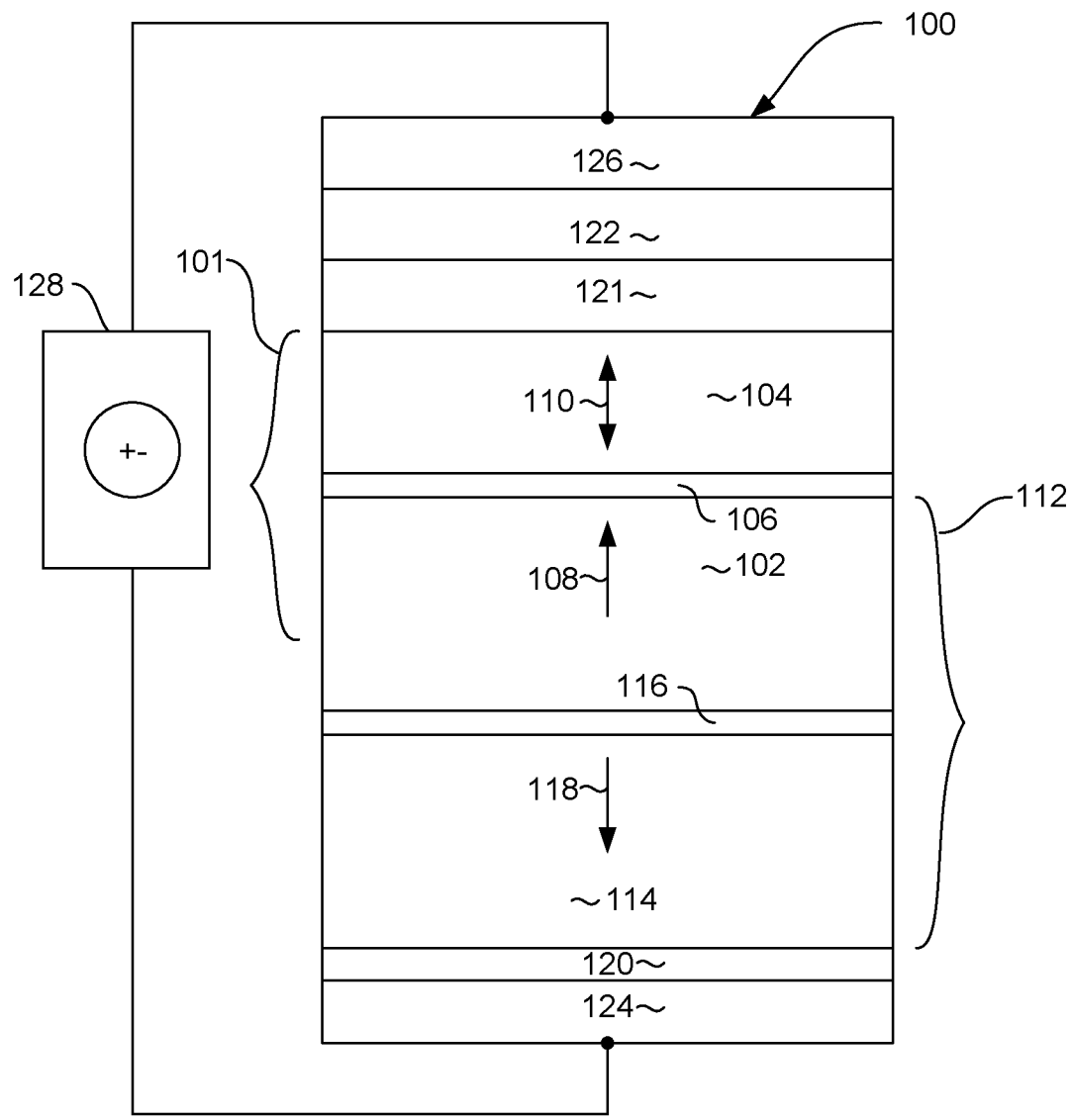
FIG. 1 is a schematic, cross sectional view of a perpendicular magnetic tunnel junction (pMTJ) element.
Figure 2:
FIGS. 2-7 show a magnetic memory element in various stages of manufacture in order to illustrate a method of manufacturing a magnetic memory element according to an embodiment of the invention.

Referring now to FIG. 1, a magnetic memory element 100 can be in the form of a perpendicular magnetic tunnel junction (pMTJ) memory element. The magnetic memory element can include an MTJ 101 that can include a magnetic reference layer 102, a magnetic free layer 104 and a thin, non-magnetic, electrically insulating barrier layer 106 located between the magnetic reference layer 102, and magnetic free layer 104. The barrier layer 106 can be an oxide such as MgO. The magnetic reference layer has a magnetization 108 that is fixed in a direction that is preferably perpendicular to the plane of the layers as indicated by arrow 108. The magnetic free layer 104 has a magnetization 110 that can be in either of two directions perpendicular to the plane of the layer 104. While the magnetization 110 of the free layer 104 remains in either of two directions perpendicular to the plane of the layer 104 in a quiescent state, it can be moved between these two directions as will be described in greater detail herein below. When the magnetization 110 of the magnetic free layer 104 is in the same direction as the magnetization 108 of the reference layer 102, the electrical resistance across the layers 102, 106, 104 is at a low resistance state. Conversely, when the magnetization 110 of the free layer 104 is opposite to the magnetization 108 of the reference layer 102, the electrical resistance across the layers 102, 106, 104 is in a high resistance state.

The magnetic reference layer 102 can be part of an anti-parallel magnetic pinning structure such as a Synthetic Anti-Ferromagnet (SAF) 112 that can include a magnetic balancing bottom layer 114, and a non-magnetic, antiparallel coupling layer (such as Ru) 116 located between the bottom SAF layer 114 and reference layer 102. The antiparallel coupling layer 116, which will be described in greater detail herein below, can be constructed to have a composition and thickness such that it will couple the layers 114, 102 in an antiparallel configuration. The antiparallel coupling between the layers 114, 102 ensures that the magnetization 108 of the reference layer 102 is in a direction opposite to the direction of magnetization 118 of the bottom SAF layer 114.

A seed layer 120 may be provided near the bottom of the memory element 100 to initiate a desired crystalline structure in the above deposited layers. A capping layer 121 may be provided near the top of the memory element 100 to protect the underlying layers during manufacture, such as during high temperature annealing and from exposure to ambient atmosphere. The capping layer 121 can be constructed of, for example, Ta. In addition, a Ru hard mask layer 122 is formed over at the top of the memory element 100 over the capping layer 121. Optionally, the Ru layer 122 can serve as both a hard mask layer and as a capping layer 121, eliminating the need for a separate capping layer 121. The use of Ru provides several advantages over other hard mask materials layer materials. For example, the Ru hard mask layer 122 does not form an electrically insulating oxide, and therefore remains a good electrical conductor, even after various processing steps that would oxidize other hard mask materials. Therefore, the Ru hard mask 122 can remain in the finished memory element 100 without imparting any parasitic resistance. In addition, Ru has a high resistance to removal by ion beach etching (also known as ion milling) and also has a high resistance to removal by chemical mechanical polishing. This advantageously allows the hard mask layer to be thinner, which in turn allows for lower spacing of memory elements and increased data density. These advantages of such a Ru capping layer 122 will be more readily appreciated with regard to various methods of manufacturing magnetic memory elements as described in greater detail herein below.

In addition, electrodes 124, 126 may be provided at the bottom and top of the memory element 100. The electrodes 124, 126 may be constructed of a non-magnetic, electrically conductive material such as one or more of Ta, W, Cu and Al can provide electrical connection with circuitry 128 that can include a current source and can further include circuitry such as CMOS circuitry for reading an electrical resistance across the memory element 100.

The magnetic free layer 104 has a perpendicular magnetic anisotropy that causes the magnetization 110 of the free layer 104 to remain stable in one of two directions perpendicular to the plane of the free layer 104. In a write mode, the orientation of the magnetization 110 of the free layer 104 can be switched between these two directions by applying an electrical current through the memory element 100 from the circuitry 128. A current in one direction will cause the memory element to flip to a first orientation, and a current in an opposite direction will cause the magnetization to flip to a second, opposite direction. For example, if the magnetization 110 is initially oriented in a downward direction in FIG. 1, applying a current in a downward direction through the element 100 will cause electrons to flow in an opposite direction upward through the element 100. The electrons travelling through the reference layer will become spin polarized as a result of the magnetization 108 of the reference layer 102. These spin polarized electrons cause a spin torque on the magnetization 110 of the free layer 104, which causes the magnetization to flip directions.

On the other hand, if the magnetization 110 of the free layer 104 is initially in an upward direction in FIG. 1, applying an electrical current through the element 100 in an upward direction will cause electrons to flow in an opposite direction, downward through the element 100. However, because the magnetization 110 of the free layer 104 is opposite to the magnetization 108 of the reference layer 102, the electrons with an opposite spin will not be able to efficiently pass through the barrier layer 106 to the reference layer 102. As a result, the electrons having an opposite spin will be reflected at barrier layer 106, and return to the free layer 104 with a spin polarization opposite that of the reference layer 102. These spin polarized electrons cause a spin torque that causes the magnetization 110 of the free layer 104 to flip from an upward direction to a downward direction.

FIGS. 2-7 illustrate a method for manufacturing a magnetic memory element having a Ru capping layer according to an embodiment. A substrate 202 is provided, which may be a semiconductor substrate such a Si substrate. In addition, the substrate 202 may have various circuitry such as CMOS circuitry (not shown) incorporated therein to facilitate writing and reading data to the magnetic memory element.

A series of magnetic memory element layers 206 are deposited over the lead layer 204. The magnetic memory element layers 206 can include layers for forming a magnetic tunnel junction element and may include a seed layer 204, a synthetic anti-ferromagnetic (SAF) structure 208, a non-magnetic barrier layer 210 such as MgO deposited over the SAF structure 208, a magnetic free layer 212 deposited over the non-magnetic barrier layer 210, and a capping layer 214 deposited over the magnetic free layer 212. The SAF structure can include a first magnetic layer (reference layer) 216 formed adjacent to the barrier layer 210, a second magnetic layer 218 opposite the reference layer 216 and a non-magnetic antiparallel exchange coupling layer 220 located between the reference layer 216 and second magnetic layer 218. The antiparallel exchange coupling layer 220 can be a material such as Ru and has a thickness that is chosen to exchange couple the magnetic layers 216, 218 in antiparallel directions relative to one another. The magnetic layers 216, 218, 212 can include one or more magnetic materials such as CoFe, CoFeB, and/or a Heusler ally. The capping layer 214 can include a non-magnetic, electrically conductive material such as Ta. The seed layer 204 can be formed of an electrically conductive material that is chosen to initiate a desired crystalline structure in the layers deposited thereover.

A novel hard mask layer 222 is deposited over the memory element layers. The hard mask layer 222 includes a layer of Ru 224, and may also include an optional RIEable layer 226 formed of a material that can be removed by reactive ion etching deposited over the Ru layer 224. A photoresist mask layer 228 is deposited over the hard mask layer 222. The use of Ru as a hard mask layer 224 provides several advantages. For example, Ru is highly resistant to removal by ion etching (ion milling) which allows the Ru layer to be deposited thinner than other hard mask layers. This reduced thickness allows for higher data density by allowing an array of memory elements to be spaced closer together for reasons that will be more clearly described herein below. In addition, Ru provide an advantage in that it does not form an oxide. This allows the Ru in the finished magnetic memory element to remain highly electrically conductive so as to not impart detrimental parasitic resistance. The RIAble layer 226 can be a material such as tantalum (Ta), tantalum nitride (TaN) or silicon oxide (SiOx). The photoresist layer 228 can include a layer of photoresist material and may also include other layers, such as a bottom antireflective coating and/or an image transfer layer.

Figure 3:
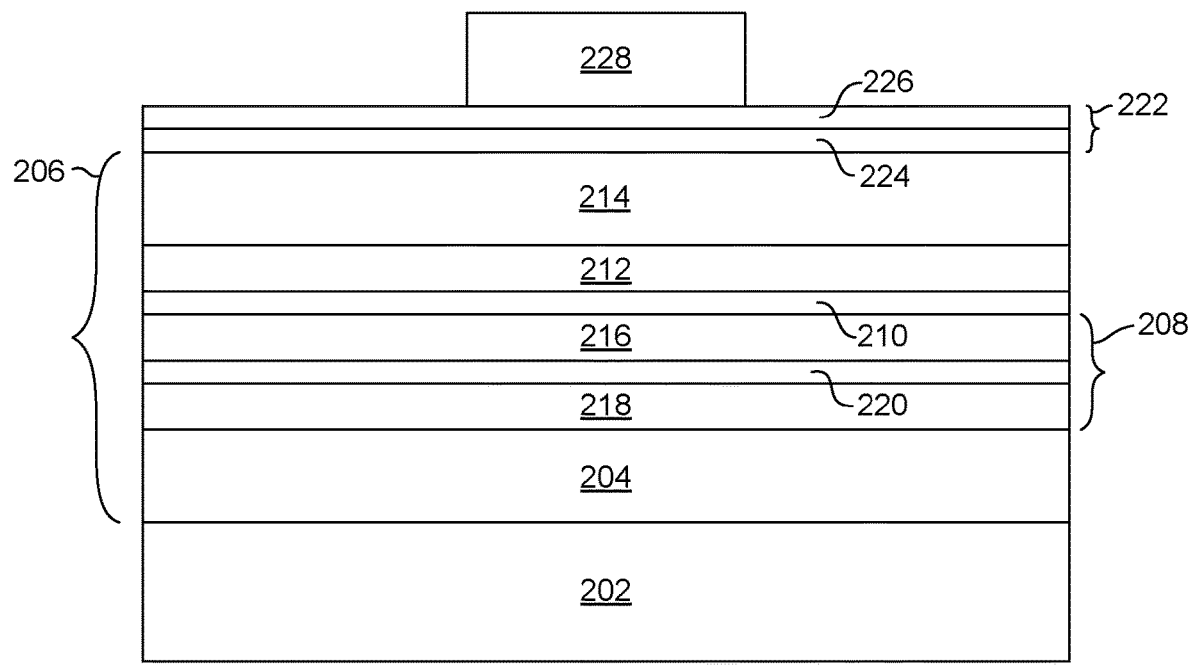

With reference now to FIG. 3, the photoresist layer 228 is photolithographically patterned to form a photoresist mask 228. The photoresist mask 228 can have a circular configuration when viewed from above, designed to form a cylindrical pillar structure as will be seen. However, this is not a requirement, and other configurations are possible as well. A reactive ion etching can then be performed to transfer the image of the photoresist mask 228 onto the underlying RIEable mask layer 226 as shown in FIG. 3. The reactive ion etching can be performed using a chemistry that is chosen to preferentially remove the layer 226. For example, if the layer 226 is Ta or TaN then the reactive ion etching can be performed using a fluorine ($F_2$) or chlorine chemistry. If the layer 226 is SiOx, then the reactive ion etching can be performed using a chemistry that includes fluorine.

Figure 4:
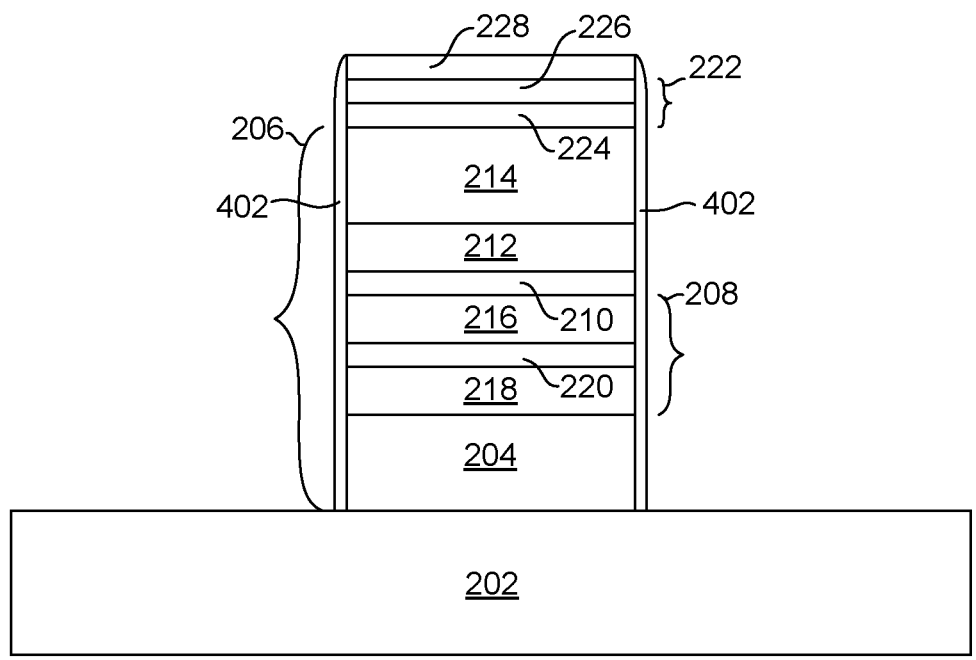

Then, with reference to FIG. 4 an ion etching, also referred to as ion milling, is performed to transfer the image of the RIEable mask 226 onto the underlying Ru hard-mask layer 224. The ion etching is further continued to remove portions of the memory element material layers 206 that are not protected by the masks 224, 226. The ion etching process may be performed at one or more angles relative to normal in order to achieve desired substantially vertical side walls on the sides of the resulting memory element pillar. The ion milling may remove all of the photoresist 228, and may also remove some or all of the RIEable mask 226. Any remaining RIEable mask 226 can be removed by reactive ion etching later, as will be described herein below.

The process of ion etching to form the memory element pillar inevitably results in the redeposition of removed material (also referred to as "redep") 402 at the sides of the memory element pillar. This redep is undesirable on the sides of the memory element pillar 206 as it can result in current shunting and reduced performance of the finished memory element. Therefore, the redep 402 should be removed prior to performing further processing. This redep 402 can be effectively removed by performing an ion etching at a high angle relative to normal, resulting in a structure without redep as shown in FIG. 5.

Figure 25A:
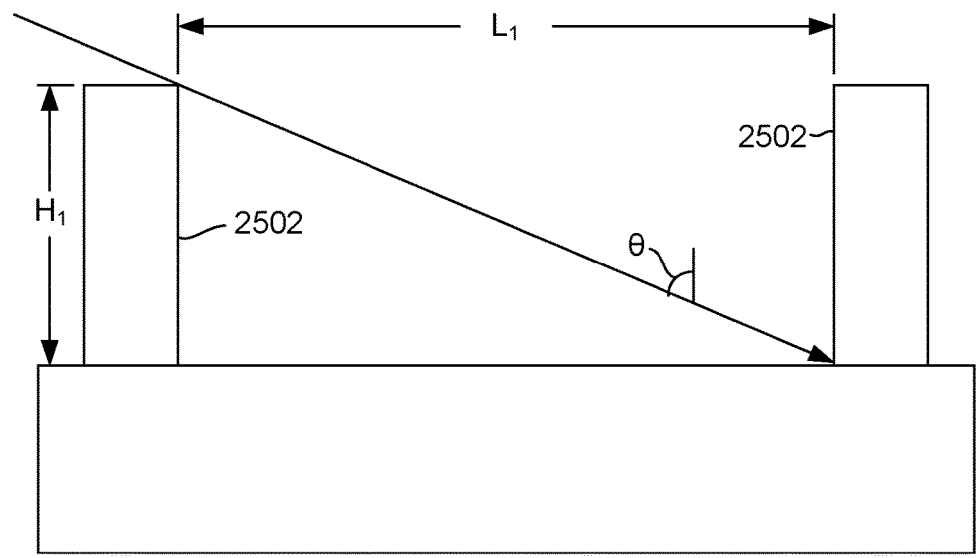
FIGS. 25a and 25b illustrate the effect of pillar height on minimum pillar spacing for a high angle ion milling process.
Figure 25B:
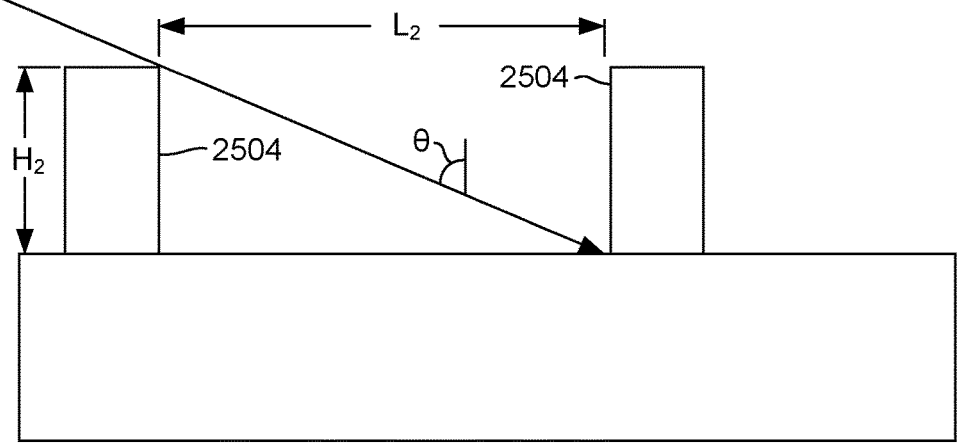

As those skilled in the art will appreciate, memory element pillars are formed as an array of many memory element pillars, and the closer these memory element pillars are spaced relative to one another the higher the data density will be. It is therefore desirable to space adjacent memory element pillars as close to one another as possible, while avoiding magnetic and electrical interference between adjacent memory element pillars. However, this reduction in spacing is limited by the need to perform the high angle milling to remove the redep 402 as previously described. This is because shadowing from adjacent pillars can prevent the high angle ion milling process from reaching the bottom of the pillars when the memory element pillars are spaced too close together. The taller the pillar structure is, the greater the shadowing effect will be. This is illustrated with reference to FIGS. 25a and 25b. FIG. 25a shows an ion milling being performed at an angle θ on an array of pillars 2502 having a first height H1, and FIG. 25b shows an ion milling being performed at the same angle θ on a second array of pillars 2504 having a height H2 that is smaller than the height H1. As can be seen in FIG. 25a, in order for the ion milling to reach the bottom of the adjacent pillar, the pillars 2502 must be spaced apart by a certain minimum distance L1. However, in FIG. 25b, where the pillars 2504 are shorter, the pillars 2504 can be spaced apart by a second minimum distance L2 that is significantly smaller than the first minimum distance L1. Therefore, reducing the height of the pillars being ion milled reduces the allowable minimum spacing between the pillars.

With reference again to FIGS. 4 and 5, the effective height of the pillar on which the high angle ion milling will be performed includes the thickness of the Ru hard mask 224. However, because Ru has a very high resistance to removal by ion milling and chemical mechanical polishing, it can be made much thinner than would be possible using other hard mask layers. This effectively reduces the height of the pillar being ion milled, and therefore advantageously allows the array of memory element pillars to be spaced significantly closer together for increased data density.

Figure 5:
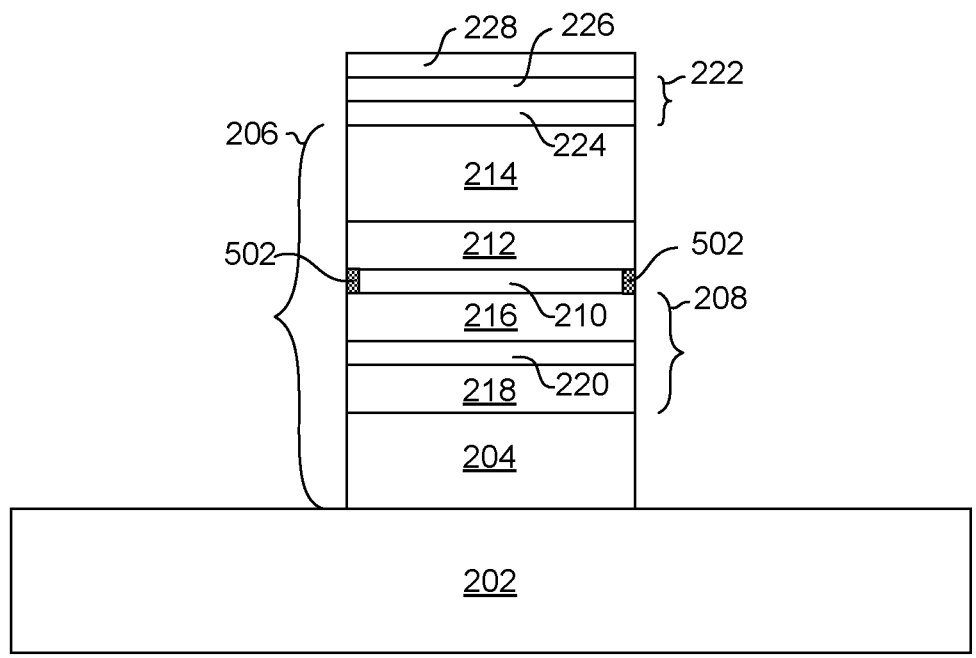

With continued reference to FIG. 5, the above described ion milling processes result in a certain amount of damage to the material layers at the outer side of the memory element pillar 206. As shown in FIG. 5, this results in a damaged region 502 at the outer edges of the non-magnetic, electrically insulating barrier layer 210. Whereas it is desirable that the barrier layer 210 be constructed of a material such as magnesium oxide (MgO) having a desirable crystalline structure, the damage caused by the ion milling can cause the damaged portion 502 to have, for example, an amorphous structure or can cause the segregation of Mg and O so that the damaged portion 502 may include Mg rather than crystalline MgO. This can result in undesirable electrical shunting through the damaged portion 502 during use. However, a post pillar annealing process, which will be described in greater detail herein below can overcome this issue by repairing the damaged portion 502 resulting in a desired crystalline MgO structure for the entire barrier layer 210.

Figure 6:
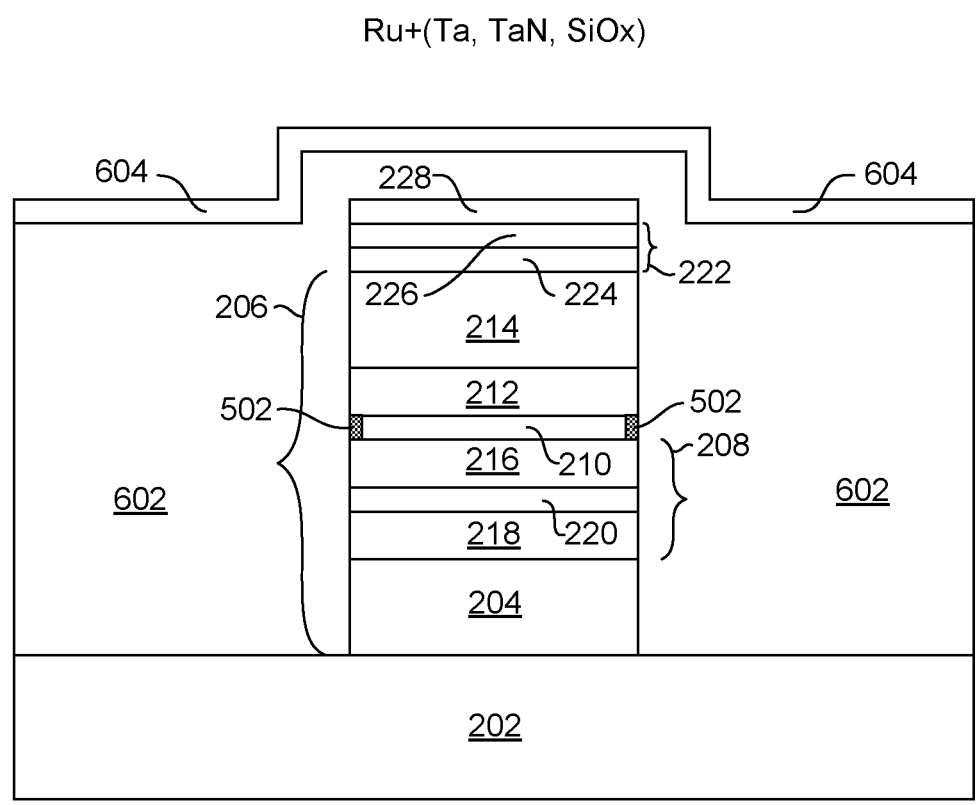

With reference now to FIG. 6, a non-magnetic, dielectric material (separation layer) such as $SiN_x$ 602 can be deposited by a process such as sputter deposition or chemical vapor deposition to a height of about the height of the memory element pillar structure 206. A layer of material that is resistant to chemical mechanical polishing and that is also removable by reactive ion etching (CMP stop layer) 604 can be deposited over the separation layer 602. The CMP stop layer 604 can be, for example, diamond like carbon or some other suitable material. In addition, Ru is advantageously very resistant to removal by chemical mechanical polishing.

Figure 7:
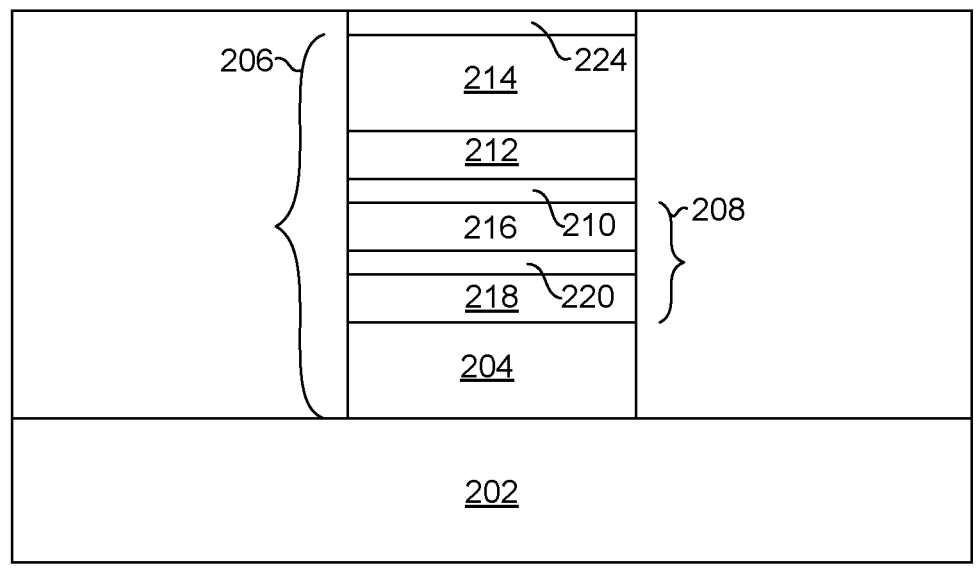
Figure 8:
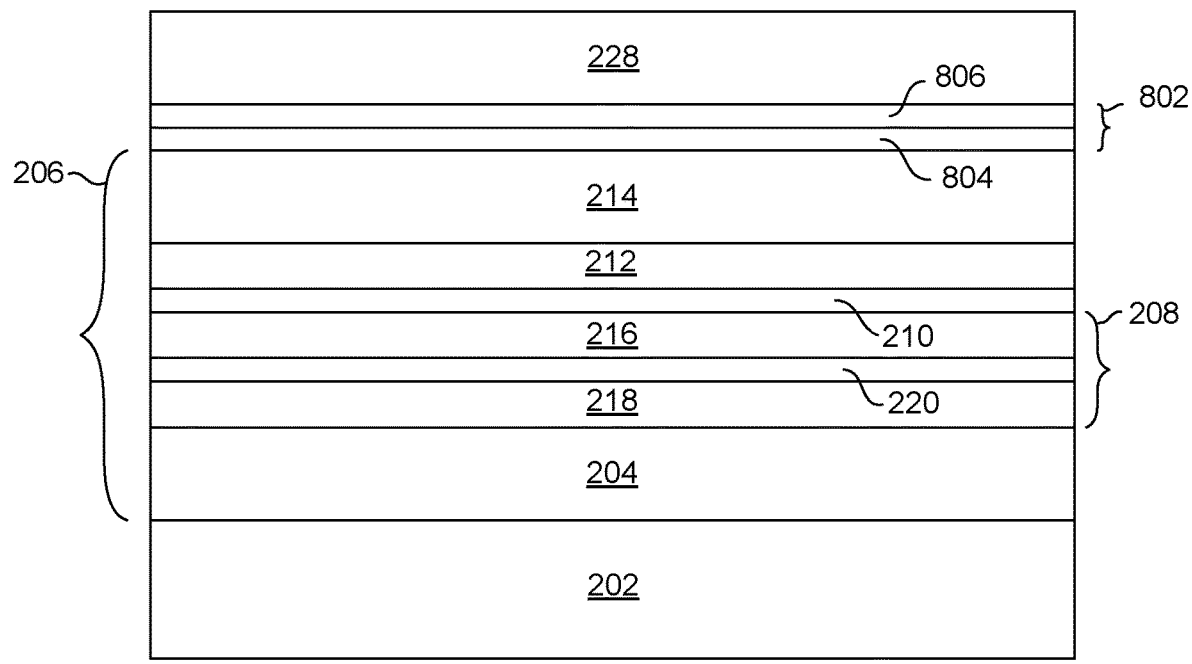
FIGS. 8-15 show a magnetic memory element in various stages of manufacture in order to illustrate a method of manufacturing a magnetic memory element according to an alternate embodiment.

Therefore, the Ru hardmask 224 also functions as an effective CMP stop layer in the region over the pillar structure. Then, a chemical mechanical polishing (CMP) is performed to planarize the structure, and a reactive ion etching can then be performed to remove the CMP stop layer 604. A reactive ion etching process can be performed to remove any remaining RIEable mask layer 226, leaving a structure as shown in FIG. 7. After this point, a post pillar annealing process can be performed to repair any damage to the barrier layer 210 (e.g. to repair the damaged portion 502 in FIG. 5) as well as to properly crystallize the layers of the pillar structure. This post pillar annealing process can include heating the entire structure (e.g. wafer) to a desired temperature for a desired duration to allow the damaged portion 502 (FIG. 6) and other layers of the pillar structure to recrystallize as desired. While this annealing process could include separate annealing steps (one to repair the damaged portion 502 and another to crystallize the other pillar layers), the annealing could be performed as a single annealing step to serve both purposes. FIGS. 8-14 show a magnetic memory element in various intermediate stages of manufacture in order to illustrate a method for manufacturing a magnetic memory element according to an alternate embodiment of the invention. With reference to FIG. 8, a plurality of layers 206 configured to define a magnetic memory element structure are deposited over a substrate 202. The layers 206 can include a seed layer or underlaying 204, a synthetic anti-ferromagnetic structure 208, a non-magnetic, electrically insulating barrier layer 210, a magnetic free layer 212 and a capping layer 214. The magnetic free layer can include one or more of Co, CoFe, a Heusler alloy or some other suitable material or combination of materials. The barrier layer 210 can be formed of an oxide and is preferably constructed of magnesium oxide MgO. The cap layer 214 can be a material such as Ta and or some other layer or combination of layers that are chosen to promote desired magnetic properties in the layers beneath and that can protect the underlying layers from damage during manufacture.

The synthetic antiferromagnetic structure 208 can include a first magnetic layer 218, a second magnetic layer which is a reference layer 216 and an anti-parallel exchange coupling layer 210 located between the first magnetic layer 218 and the reference layer 216. The first magnetic layer 218 and reference layer 216 can each be constructed of one or more of CoFe, CoFeB, a Heusler alloy or some other suitable magnetic material. The anti-parallel exchange coupling layer 220 can be formed of a material such as Ru that has a thickness that is chosen to strongly anti-parallel exchange couple the first magnetic layer 218 with the reference layer 216 so that they have magnetizations that are pinned in opposite directions perpendicular to the plane of the layers 218, 216.

A novel hard mask structure 802 is deposited over the memory element layers 206, and a layer of photoresist material 228 is deposited over the novel hard mask structure 802. The novel hard mask structure 802 includes a layer of Ru 804 and a layer of carbon, preferably diamond like carbon (DLC) 806 deposited over the layer of Ru 804. The hard mask structure 802 can include other layers as well, such as one or more of Ta, TaN or $SiO_x$ (not shown) deposited over the layer of Ru. As discussed above, the use of Ru as a hard mask layer provides several advantages over the use of other hard mask layers. For example, Ru does not oxidize, and therefore, provides a good electrically conductive hard-mask/capping layer that can be left in the finished memory element without imparting undesirable parasitic resistance to the memory element structure. In addition, as discussed above, Ru has a good resistance to removal by ion etching (ion milling) as well as chemical mechanical polishing so that it can be deposited thinner than other hard mask materials. As discussed above, this results in less shadowing effect, which allows memory element pillars to be spaced closer together for improved data density.

In addition, the use of diamond like carbon 806 provides additional benefits over other hard mask materials. The diamond like carbon can be removed by reactive ion etching, and therefore can be patterned by reactive ion etching to form an effective hard mask for patterning the underlying Ru layer 804, as will be seen. This ability to remove the diamond like carbon by reactive ion etching also allows the diamond like carbon to be effectively removed after pillar formation by reactive ion etching, thereby ensuring good electrical conductivity. Another significant advantage of diamond like carbon is that it has excellent resistance to chemical mechanical polishing (CMP) thereby making it a good CMP stop layer as will be seen.

Figure 9:
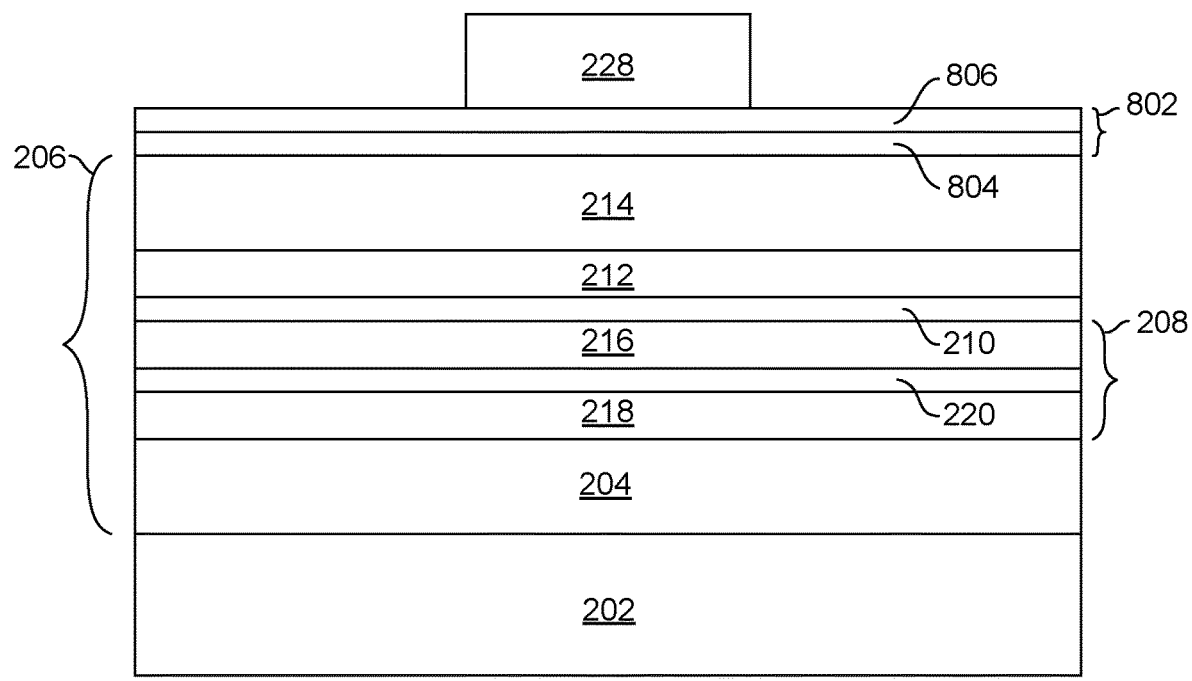
Figure 10:
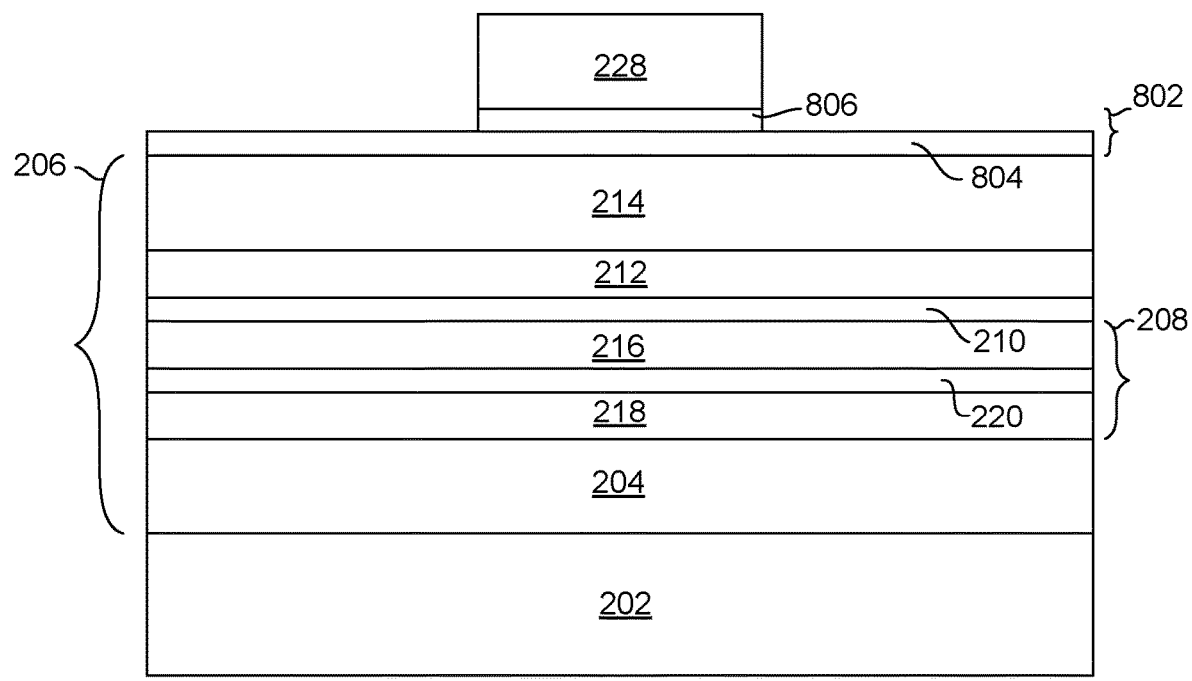

With reference now to FIG. 9, the photoresist layer 228 is photolithographically patterned to have a shape that is configured to define a magnetic memory element pillar. As discussed above, the photoresist mask 228 can be patterned to have a generally circular shape when viewed from above in order to define a cylindrical pillar there-beneath. However, this is not a requirement. Then, with reference to FIG. 10, a reactive ion etching is performed to transfer the image of the photoresist mask 228 onto the underlying DLC layer 806, leaving a patterned DLC hard mask 806 as shown in FIG. 10. The reactive ion etching is performed using an atmosphere that is chosen to preferentially remove carbon (DLC). Therefore, this reactive ion etching can be performed in an oxygen ($O_2$) atmosphere, which readily removes carbon. In addition, as mentioned above, other mask layers such as Ta, TaN or SiOx (not shown) can be included in addition to the DLC layer 806. The use of these additional mask layers may involve additional reactive ion etching steps configured to remove such additional layers. For example, if a layer to Ta or TaN is deposited over the layer of DLC 806, a first reactive ion etching can be performed using an atmosphere that contains fluorine or chlorine. This first reactive ion etching in a fluorine or chlorine atmosphere can be used to transfer the image of the photoresist mask onto the underlying Ta or TaN mask layer. Then, a second reactive ion etching can be performed in a $O_2$ containing atmosphere to transfer the image of the patterned Ta or TaN mask onto the DLC layer 806. On the other hand, if a layer of SiOx is formed over the DLC layer, this material can be removed using a fluorine atmosphere. Then, a reactive ion etching using an $O_2$ atmosphere can be used to transfer the image of the hard mask onto the underlying DLC layer.

Figure 11:
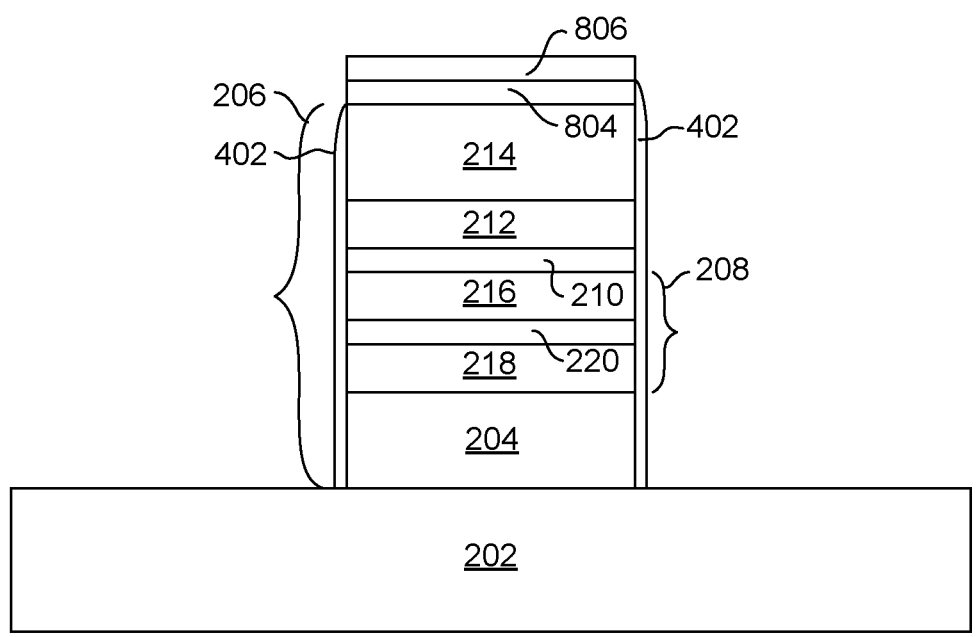

Then, with reference to FIG. 11, an ion etching (also referred to as ion milling) is performed to transfer the image of the patterned DLC mask 806 (and other mask layers if present) onto the underlying Ru hard mask layer 804. This ion milling can be continued to remove the memory element material 206 in order to define a memory element pillar structure as shown. In addition, the DLC mask layer 806, which is also resistant to removal by ion milling, can remain substantially intact after the ion milling. This advantageously allows the Ru hard-mask 804 to be deposited thinner than would otherwise be possible, while also allowing the remaining DLC mask 806 to be later removed by reactive ion etching.

Figure 12:
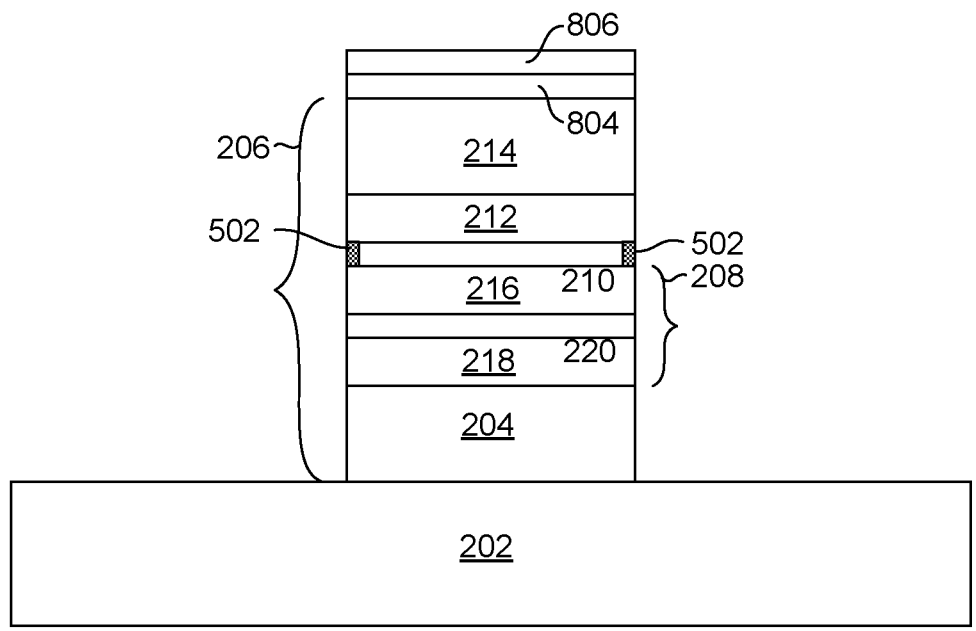

This ion milling process results in the redeposition of material (redep) 402 on the sides of the memory element pillar 206. As previously discussed, this redeposited material can result in current shunting in a finished memory element structure. Therefore, a high angle (e.g. glancing angle) ion milling process can be performed to remove the redeposited material 402 from the sides of the memory element pillar 206, leaving a structure as shown in FIG. 12. The Ru hard mask layer 804 and the DLC hard mask 806 protect the upper portion of the memory element pillar 20. As seen in FIG. 12, this high angle ion milling can result in damage to the material at the outer edge of the memory element pillar. More specifically, the high angle ion milling can result in damage (represented as shaded area 502) at the outer edge of the barrier layer 210. As a result, the damaged outer portion 502 of the barrier layer 210 may have an amorphous structure rather than the desirable crystalline structure. This can result in the outer portion being electrically conductive and not functioning as an effective tunnel barrier, and as a result can lead to current shunting through the damaged outer portion 502. A post pillar annealing process, which will be described in greater detail herein below can correct this by reordering the damaged portion 502 into a desired crystalline state.

Figure 13:
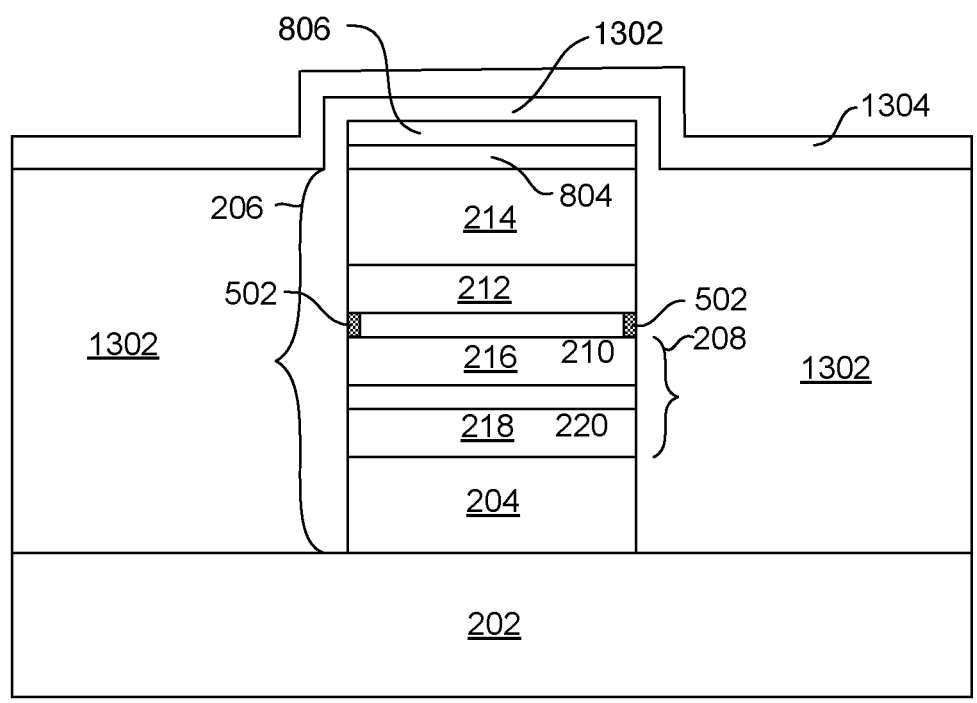
Figure 14:
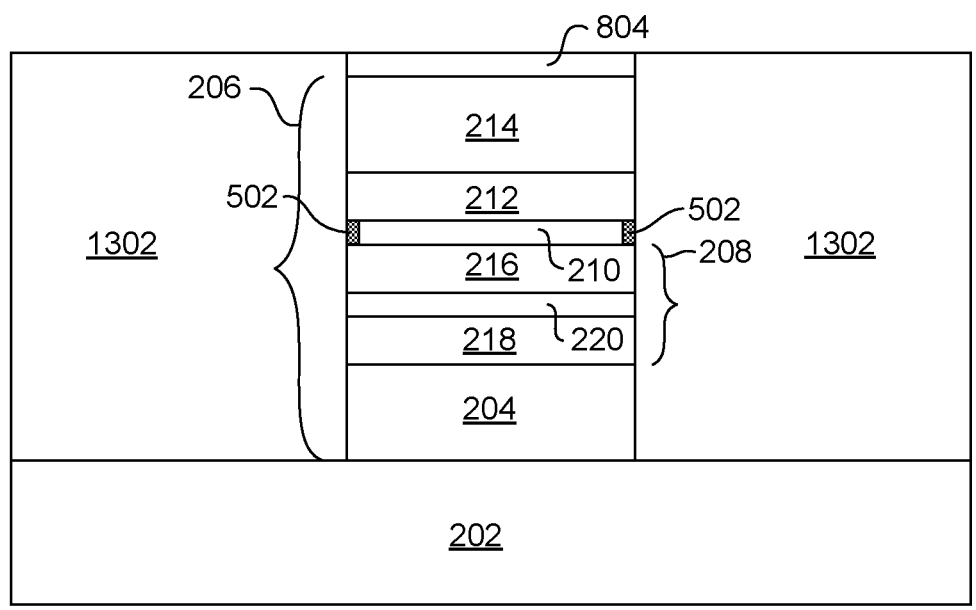

With reference now to FIG. 13, a non-magnetic, dielectric isolation layer such as SiNx 1302 is deposited to a height that is at least as high as the top of the memory element structure. A CMP stop layer 1304, such as diamond like carbon (DLC) can then be deposited over the dielectric isolation layer 1302. Then, a chemical mechanical polishing is performed to planarize the surface. A reactive ion etching can then be performed to remove any remaining CMP stop layer 1304 and any remaining DLC hard mask layer 806, leaving a structure as shown in FIG. 14. As shown in FIG. 14, only the Ru hard mask 804 remains over the memory element structure 206. Advantageously, because the Ru hard mask 804 does not oxidize it can be left in the finished structure without imparting any parasitic resistance to the memory element layer. An electrically conductive top contact can be added over the Ru layer 804.

Figure 15:
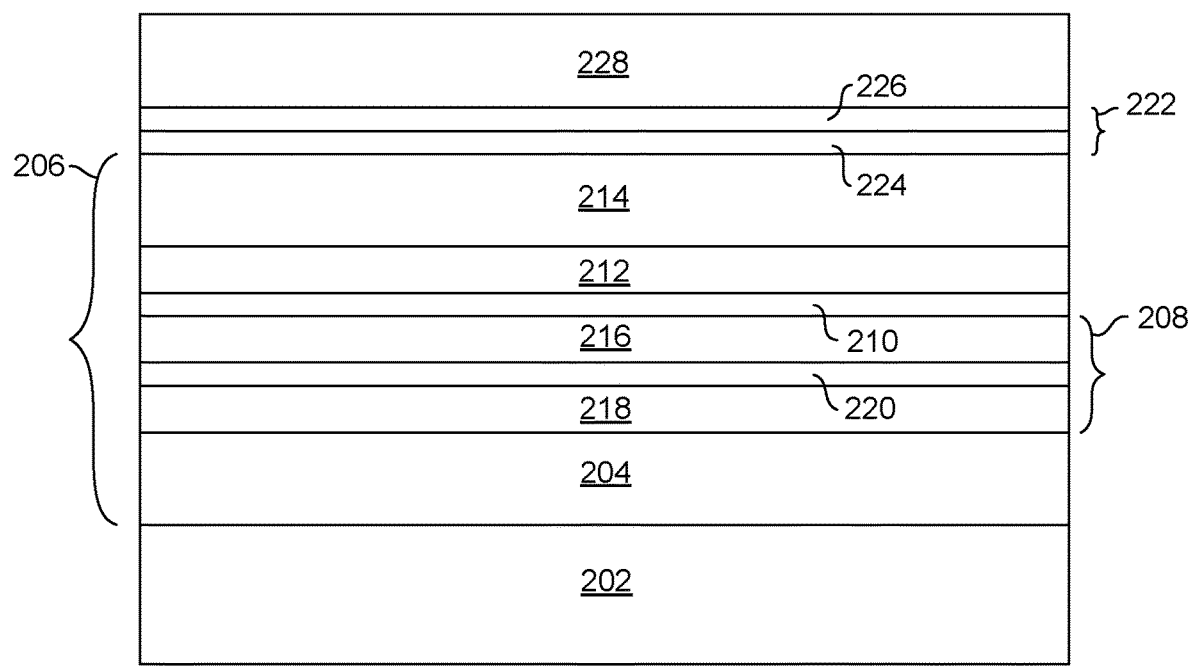

FIGS. 15-24 illustrate a method for manufacturing a magnetic memory element according to still another embodiment. This method is a self-aligned partial mill process that results in improved properties of the memory element layers, especially with regard to the tunnel barrier layer. This method can be implemented with any of the above novel hard mask structures. With reference to FIG. 15, a substrate 202 is provided, which may be a silicon wafer substrate and which may include circuitry such as CMOS circuitry formed therein. A series of memory element layers 206 are deposited over the substrate 202. The memory element layers 206 can include a seed layer 204, synthetic antiferromagnetic structure (SAF) 208, a non-magnetic barrier layer 220, a magnetic free layer 212 and a capping layer 214. The synthetic antiferromagnetic structure 208 can include first and second magnetic layers 218, 216 and a non-magnetic anti-parallel exchange coupling layer 220 located between the first and second magnetic layers 218, 216. The various layers of the memory element 206 can include materials such as those discussed above, with regard to FIGS. 2-7 and 8-15. The memory element layers 206 can include other additional layers as well, such as but not limited to a spin current structure (not shown). A hard mask structure 222 can be deposited over the memory element layers 206. The hard mask structure 222 can be any of the above described hard mask structures. For example, the hard mask structure 222 can include a layer of Ru 224 and a RIEable layer 226, which can be one or more of Ta, TaN, SiOx or diamond like carbon (DLC) deposited over the Ru hard mask 224. Alternatively, the hard mask structure 222 can include only the layer of Ru 224 with no RIEable layer 226 deposited there-over. A photoresist layer 228 is then formed over the hard mask structure 222. The photoresist layer 228 can be spun onto the hard mask layer 222 by techniques familiar to those skilled in the art.

Figure 16:
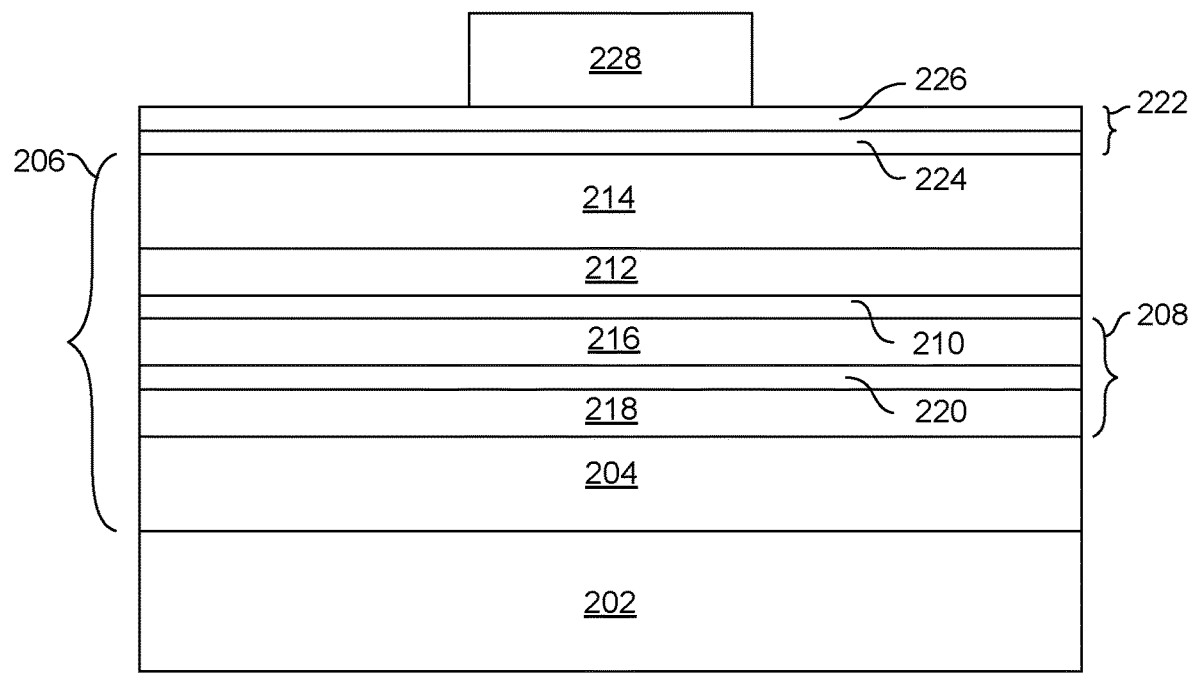
FIGS. 16-24 show a magnetic memory element in various stages of manufacture in order to illustrate a method of manufacturing a magnetic memory element according to yet another embodiment.
Figure 17:
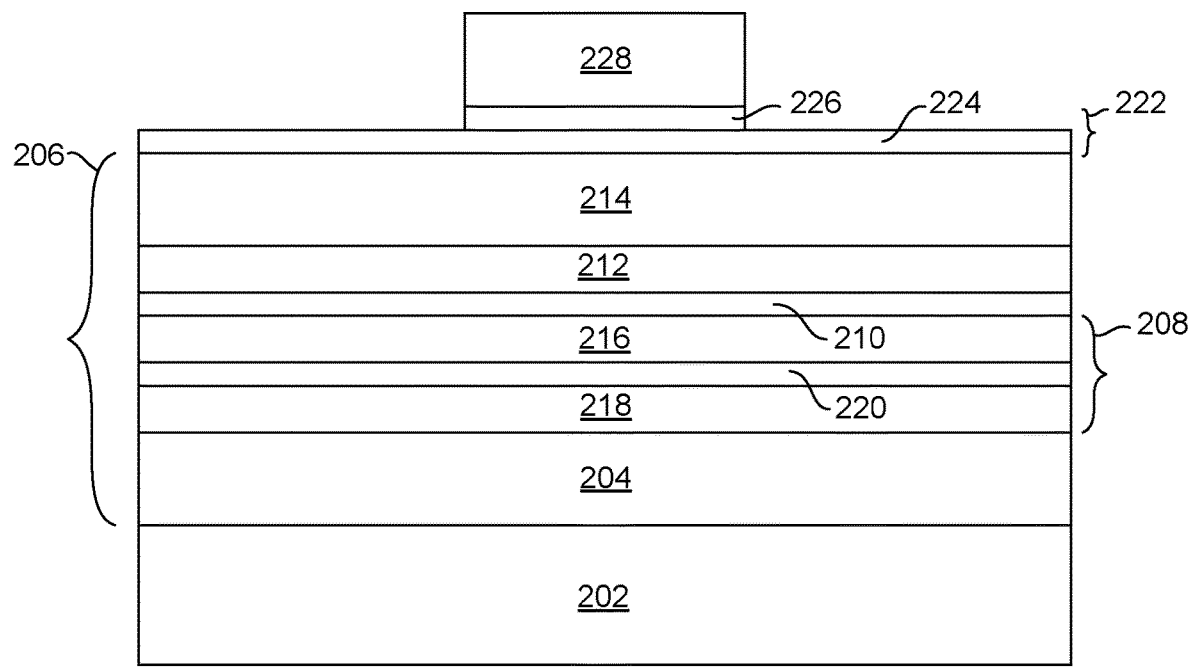

With reference now to FIG. 16, the photoresist layer 228 is photolithographically patterned and developed to form a photoresist mask as shown, configured to define an upper portion of a memory element pillar structure. As described above, the patterned photoresist mask 228 can be configured to have a circular shape as viewed from above. With reference to FIG. 17, a reactive ion etching process is performed to transfer the image of the photoresist mask onto the underlying RIEable hard mask layer 226. This reactive ion etching is performed in an atmosphere that is chosen to effectively remove the material making up the RIEable hard mask layer 226. For example, if the RIEable hard mask 226 is Ta or TaN, the reactive ion etching can be performed using a fluorine or chlorine atmosphere. If the mask layer 226 is SiOx a fluorine chemistry can be used, and if the mask 226 is diamond like carbon (DLC) the reactive ion etching can be performed in an oxygen atmosphere ($O_2$).

Figure 18:
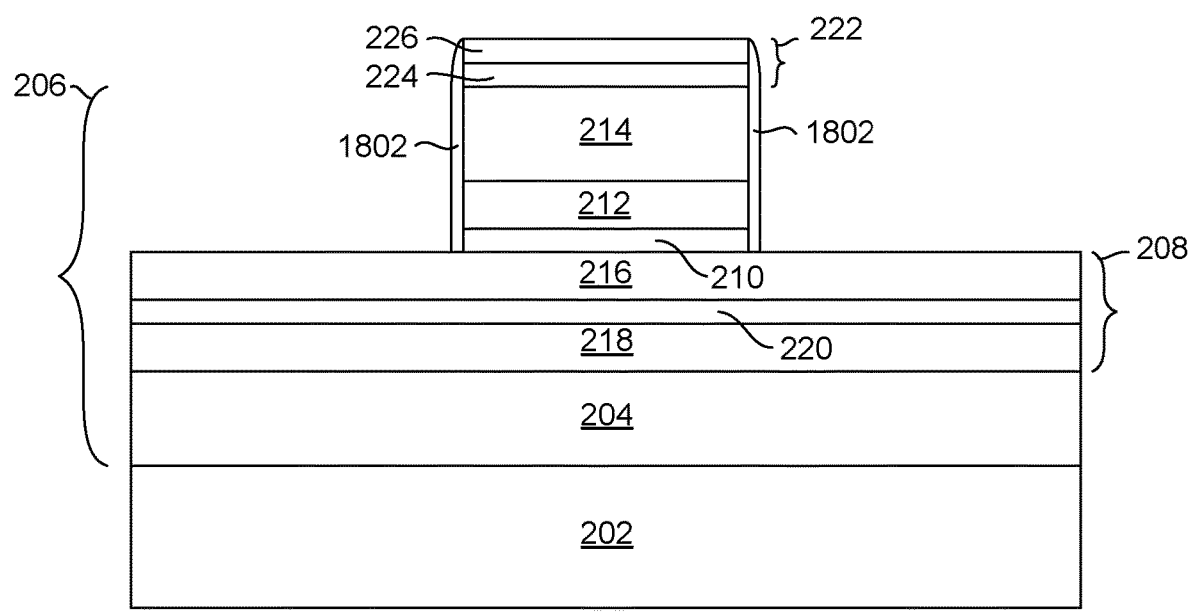

Then, with reference to FIG. 18, a first ion beam etching (also referred to as ion milling) is performed. This first ion milling is performed so as to extend only partially through the plurality of memory element layers 206. More preferably the first ion milling is performed until the barrier layer 210 has been removed or soon thereafter, which would remove material slightly into the reference layer 216. This ion milling results in a certain amount of redeposited material 1802 on the sides of the ion milled portion of the memory element layers 206, as shown in FIG. 18. However, advantageously, since the first ion milling only removes a portion of the layers of the memory element 1802, the amount of redeposited material 1802 is greatly reduced compared with the amount of redeposited material that would be present if a full ion milling process were performed that would remove all of the layers of the memory element 206.

Figure 19:
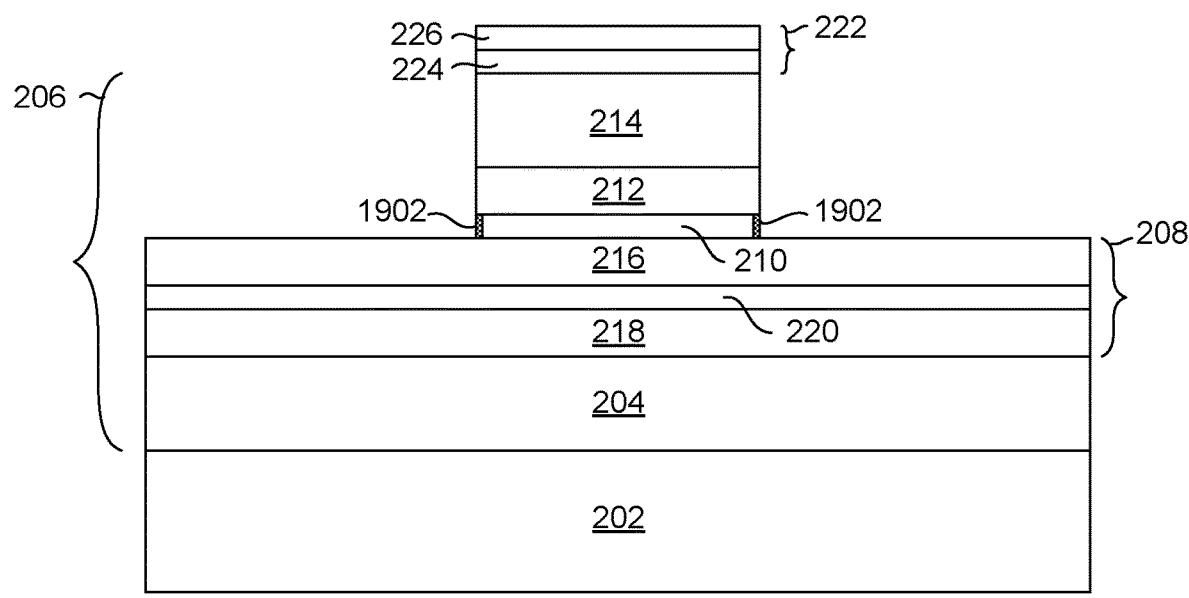

Then, a high angle ion milling (high angle relative to normal, or "glancing" angle) is performed to remove the redeposited material 1802 from the sides of the ion milled portion of the memory element, leaving a structure as shown in FIG. 19. The high angle ion milling also results in a small amount of damage to the outer edge of the non-magnetic barrier layer, as indicated by shaded area 1902. The above described partial first ion milling provides multiple advantages. Firstly, because the amount of redeposited material is significantly less than would be present with a full ion milling, a less aggressive high angle ion milling is needed to remove the redeposited material 1802. This results in less damage to the sides of the memory element, and more specifically damage 1902 to the outer edge of the non-magnetic, barrier layer 210. In addition, as discussed above with reference to FIGS. 26a and 26b, the amount by which the spacing between adjacent memory element pillars can be reduced is limited by the height of the memory element pillars during the high angle ion milling. In the case of the above described first partial ion milling, however, the height of the pillar during the high angle ion milling is greatly reduced. This advantageously allows the memory element pillars in the array to be spaced much closer together with much less limitation resulting from shadowing effects from adjacent memory element pillars. This, therefore, allows for greater data density in the memory element array.

Figure 20:
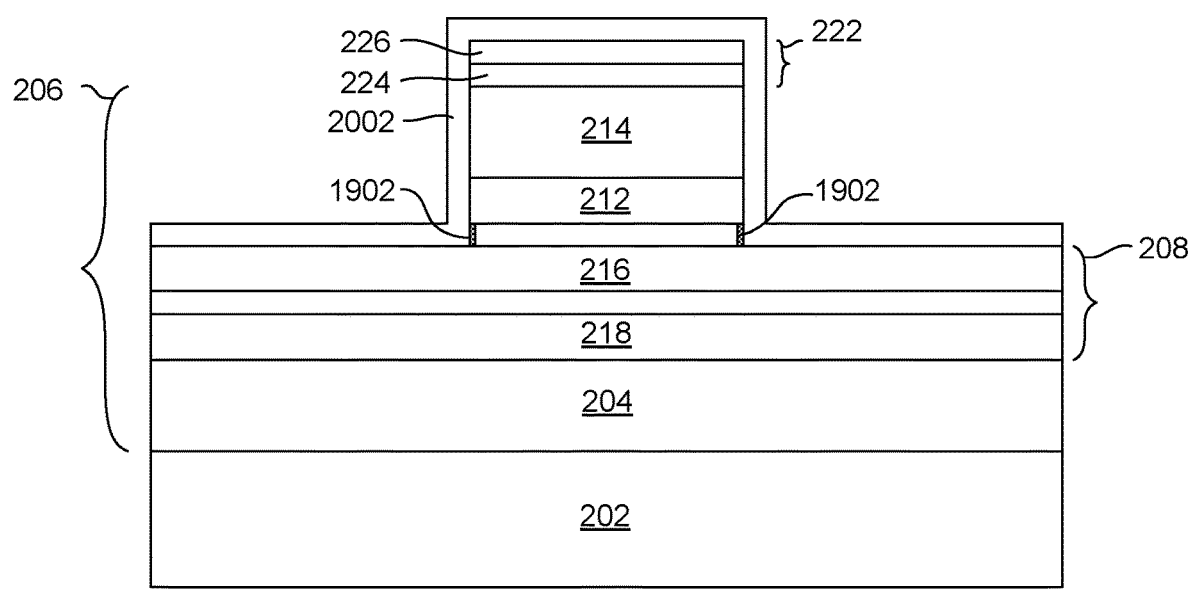
Figure 21:
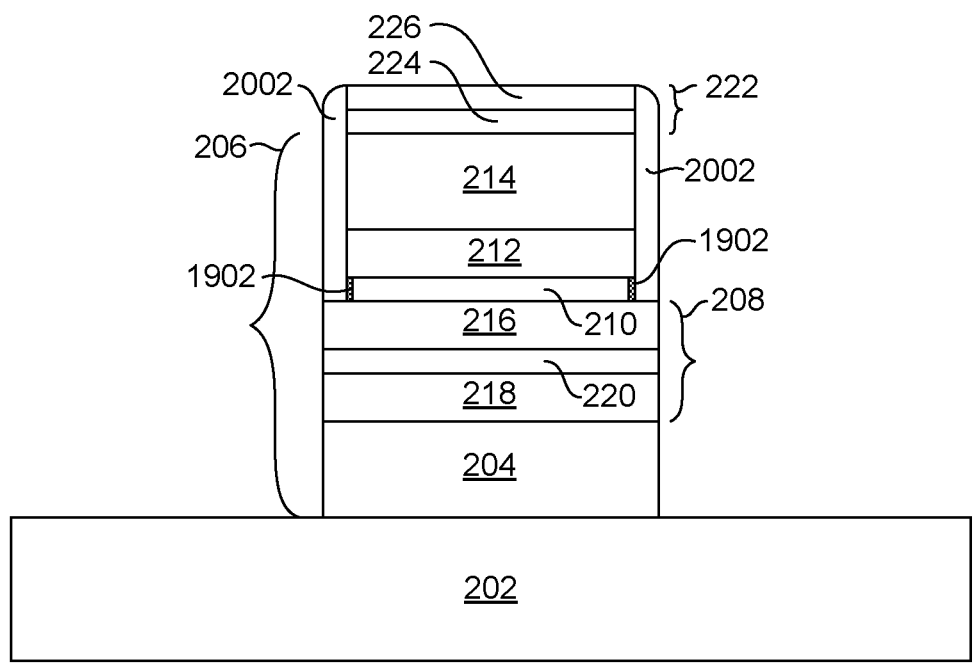

With reference now to FIG. 20, a layer of non-magnetic, electrically insulating material (insulation layer) 2002 is deposited. The insulation layer can be SiN or some other suitable material and can be deposited by sputter deposition, atomic layer deposition (ALD) or chemical vapor deposition (CVD). Then, with reference to FIG. 21, a second ion milling is performed to remove the rest of the memory element layers 206. This ion milling can be terminated at the substrate 202 or at a bottom layer that is not electrically conductive so as to avoid current shunting between adjacent memory element pillars. As can be seen, the insulation layer 2002 protects the previously defined portion of the memory element 206, and more specifically protects the previously defined barrier layer 212 during this second ion milling.

Figure 22:
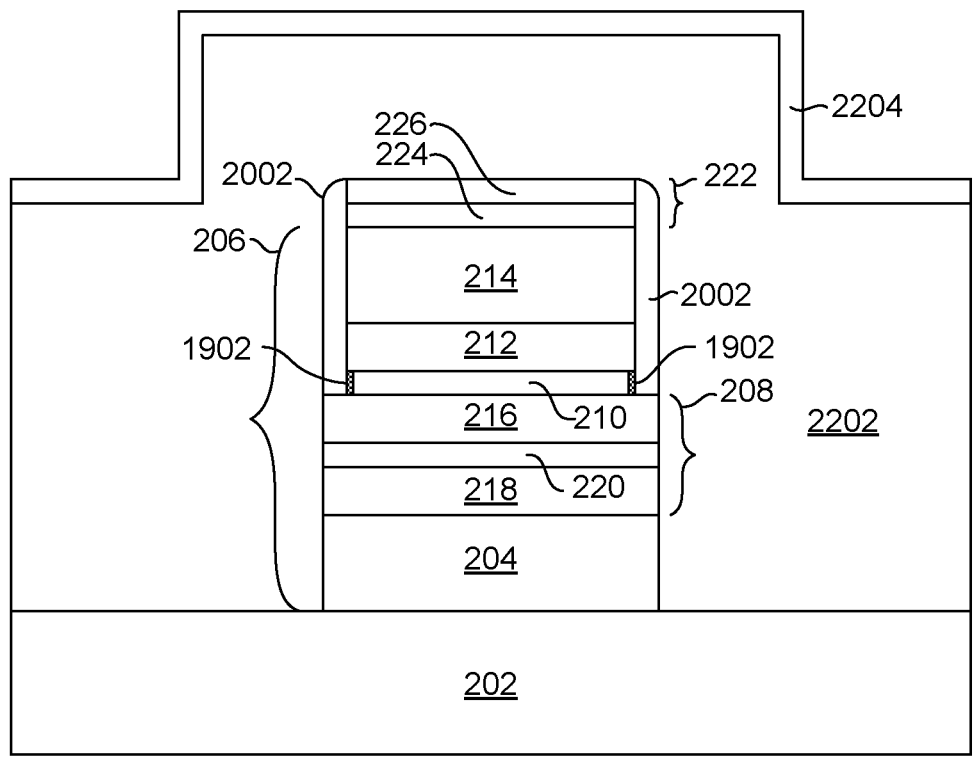

With reference now to FIG. 22, a non-magnetic, dielectric isolation layer 2202 is deposited, preferably to a height that is substantially level with the top of memory element layers 206. A CMP stop layer 2204 is then deposited over the non-magnetic, dielectric isolation layer 2202. The non-magnetic, dielectric isolation layer 2202 can be an oxide such as silicon oxide SiOx, which can be deposited by sputter deposition, for example. The CMP stop layer 2204 is a layer of material that is resistant to removal by chemical mechanical polishing. The CMP stop layer is preferably diamond like carbon (DLC), which can be deposited by sputter deposition, atomic layer deposition (ALD) or chemical vapor deposition (CVD).

Figure 23:
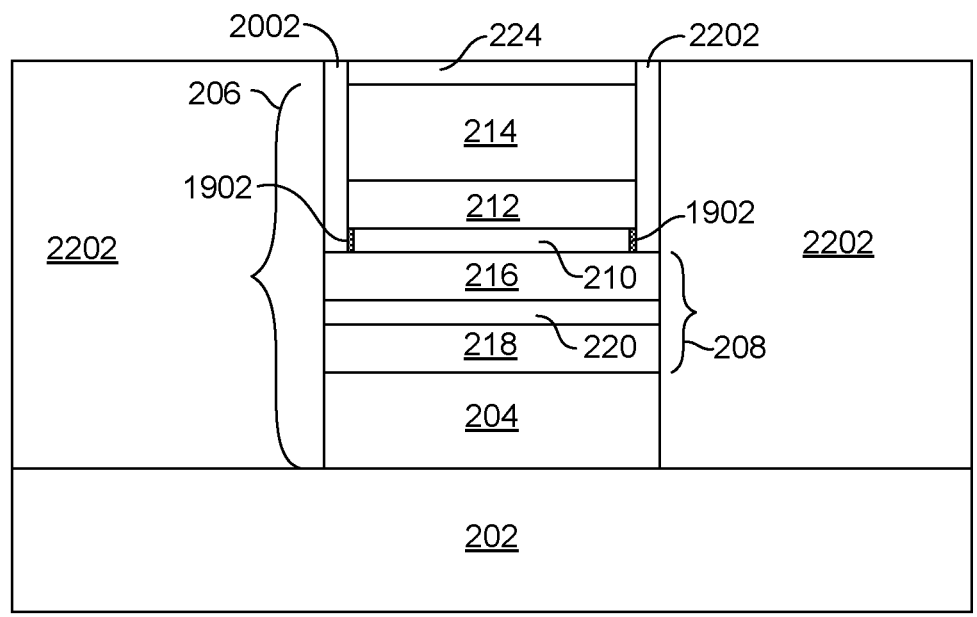

A chemical mechanical polishing can then be performed to planarize the structure, and a reactive ion etching can be performed to remove the CMP stop layer 2204. A reactive ion etching can also be performed to remove the RIEable mask layer 226. This leaves a structure as shown in FIG. 23. If the CMP stop layer 2204 is diamond like carbon (DLC), the reactive ion etching can be performed using an oxygen containing atmosphere (02). If the RIEable mask layer 226 is SiOx or diamond like carbon (DLC), a reactive ion etching using an oxygen chemistry can also be used to remove the mask layer 226. If the mask layer 226 is Ta or TaN, then a reactive ion etching using a fluorine ($F_2$) or chlorine chemistry can be used to remove the mask layer 226. If the mask 226 is SiOx, a fluorine chemistry can be used, and if the mask 226 is DLC an oxygen chemistry can be used. As can be seen, the above processes result in a structure wherein the Ru cap layer 224 remains exposed at the top above the top of the memory element pillar 206. As previously discussed, because the Ru cap layer does not form an electrically insulating oxide and is highly electrically conductive, it can remain in the finished structure without imparting any parasitic resistance to the memory cell structure.

Figure 24:
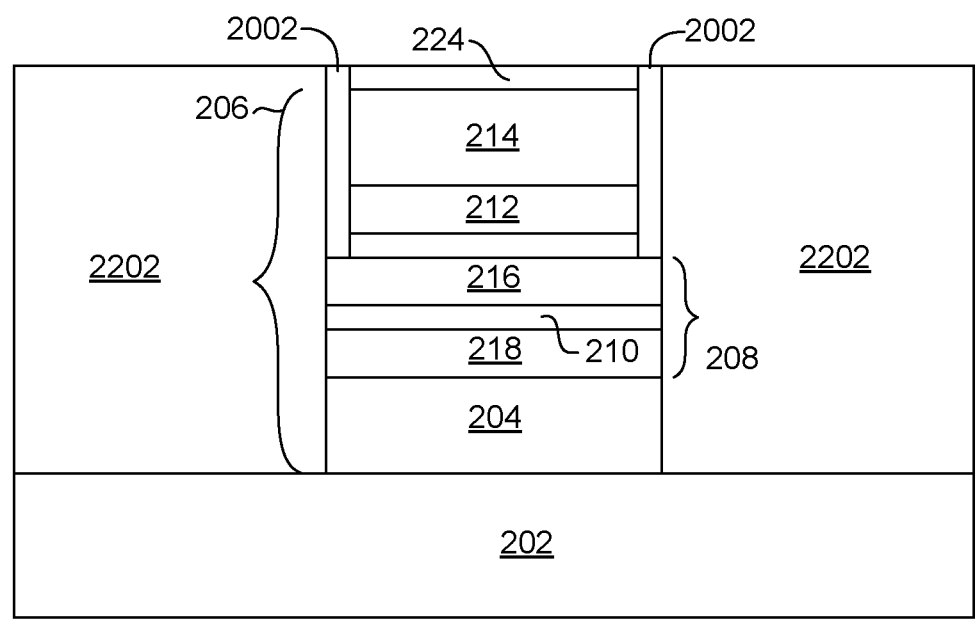

At this point, a post pillar formation annealing process can be performed to repair the damaged outer portion 1902 of the barrier layer 210 that resulted from the previous high angle ion milling operation, leaving a structure as shown in FIG. 24, with the damaged portion 1902 repaired. As described above, the self-aligned process results in significantly less damage 1902 to the outer portion of the barrier layer 210. As a result, the amount of annealing needed to repair the outer edge of the barrier layer to its desired crystalline state can be advantageously reduced. It should be pointed out that, the post pillar annealing process could also be performed after deposition of the dielectric isolation layer 2202 and before the chemical mechanical polishing and reactive ion etching processes have been performed.

While various embodiments have been described above, it should be understood that they have been presented by way of example only and not limitation. Other embodiments falling within the scope of the invention may also become apparent to those skilled in the art. Thus, the breadth and scope of the inventions should not be limited by any of the above-described exemplary embodiments but should be defined only in accordance with the following claims and their equivalents.

What is claimed is:

1. A method for manufacturing a magnetic memory structure, the method comprising:
depositing a plurality of memory element layers over a substrate, the plurality of memory element layers comprising a first magnetic layer formed over the substrate, a non-magnetic, electrically insulating barrier layer formed over the first magnetic layer, and a second magnetic layer formed over the barrier layer;
depositing a Ru hard mask layer over the plurality of memory element layers;
forming a mask structure over the Ru hard mask layer;
performing a first ion beam etching process using the mask structure to etch exposed portions of the Ru hard mask layer and to continue to etch partially through exposed portions of the plurality of memory element layers until the barrier layer is removed, forming a partial memory element pillar;
forming an insulation layer on the formed partial memory element pillar and the remaining memory element layers; and
performing a second ion beam etching process to remove remaining exposed portions of the plurality of memory element layers not formed under the partial memory element pillar, to form a complete memory element pillar.

2. The method of claim 1, wherein forming the mask structure over the Ru hard mask layer comprises:
depositing a photoresist layer over the Ru hard mask layer; and
photolithographically patterning the photoresist layer.

3. The method of claim 1, wherein forming the mask structure over the Ru hard mask comprises:
depositing a RIEable layer over the Ru hard mask layer;
depositing a photoresist layer over the RIEable layer;
photolithographically patterning the photoresist layer to form an image of a photoresist mask; and
performing a reactive ion etching to transfer the image of the photoresist mask onto the underlying RIEable layer to form a RIEable mask structure.

4. The method of claim 3, wherein the reactive ion etching process is performed in an atmosphere that is chosen to remove a material of the RIEable layer.

5. The method of claim 4, wherein the material of the RIEable layer is a material that can be removed by the reactive ion etching process but that has a slow etch rate during removal by the ion beam etching process.

6. The method of claim 4, wherein the material of the RIEable layer comprises a layer of diamond like carbon.

7. The method of claim 4, wherein the material of the RIEable layer comprises a layer of one or more of tantalum or tantalum nitride or silicon oxide.

8. The method of claim 7, wherein performing the reactive ion etching process to transfer the image of the photoresist mask onto the underlying RIEable layer to form a RIEable mask structure comprises:
performing the reactive ion etching in an atmosphere that includes fluorine or chlorine, to transfer the image of the photoresist mask onto the layer of one or more of a tantalum or tantalum nitride.

9. The method of claim 3, further comprising:
after forming the complete memory element pillar, depositing a non-magnetic dielectric isolation layer on the memory element pillar;
depositing a chemical mechanical polishing stop layer over the non-magnetic dielectric isolation layer; and
performing a chemical mechanical polishing process to planarize the formed magnetic memory structure.

10. The method of claim 9, wherein the non-magnetic dielectric isolation layer is deposited to a height substantially level with a top of the plurality of memory element layers.

11. The method of claim 9, further comprising:
performing a second reactive ion etching process to remove the chemical mechanical polishing stop layer; and
performing a third reactive ion etching process to remove the RIEable layer from the completed memory element pillar.

12. The method of claim 9, further comprising:
after depositing the non-magnetic dielectric isolation layer, performing a post pillar formation annealing process to repair outer portions of the barrier layer damaged during the first ion beam etching process.

13. The method of claim 6, wherein performing the reactive ion etching process to transfer the image of the photoresist mask onto the underlying RIEable layer to form a RIEable mask structure comprises:
performing the reactive ion etching in an atmosphere that includes 02, to transfer the image of the photoresist mask onto the layer of diamond like carbon.

14. The method of claim 1, wherein forming the insulation layer on sidewalls of the formed partial memory element pillar comprises:
depositing the insulation layer on the formed partial memory element pillar and the remaining memory element layers by one of sputter deposition, atomic layer deposition or chemical vapor deposition.

15. The method of claim 1, further comprising:
subsequent to forming the partial memory element pillar after the first ion beam etching process and before forming the insulation layer, performing a high angle ion milling process to remove redeposited material formed on sides of the partial memory element pillar.

16. The method of claim 15, wherein the high angle ion milling process is performed at a glancing angle relative to normal.

17. The method of claim 1, wherein performing the second ion beam etching process comprises performing the second ion beam etching process as a self-aligned etch process.

* * * * *